(12) United States Patent
Zhang et al.

(10) Patent No.: US 9,449,542 B2
(45) Date of Patent: Sep. 20, 2016

(54) GATE DRIVING CIRCUIT, ARRAY SUBSTRATE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Xiaojie Zhang, Beijing (CN); Xianjie Shao, Beijing (CN); Xiaohe Li, Beijing (CN); Wei Xue, Beijing (CN); Zhifu Dong, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 104 days.

(21) Appl. No.: 14/501,793

(22) Filed: Sep. 30, 2014

(65) Prior Publication Data
US 2015/0318053 A1 Nov. 5, 2015

(30) Foreign Application Priority Data
May 4, 2014 (CN) .......................... 2014 1 0184481

(51) Int. Cl.
G11C 19/00 (2006.01)
G09G 3/20 (2006.01)
G11C 19/28 (2006.01)
G09G 3/36 (2006.01)

(52) U.S. Cl.
CPC *G09G 3/20* (2013.01); *G09G 3/36* (2013.01); *G09G 3/3677* (2013.01); *G11C 19/28* (2013.01); *G09G 2300/0408* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 2010/0109995 A1* | 5/2010 | Fang | .................... | G09G 3/3677 345/100 |
| 2010/0245301 A1* | 9/2010 | Shang | .................. | G09G 3/3677 345/204 |
| 2014/0119492 A1* | 5/2014 | Liu | ........................ | G11C 19/28 377/64 |
| 2014/0159997 A1* | 6/2014 | Chen | .................... | G09G 3/3611 345/87 |
| 2014/0169518 A1* | 6/2014 | Kong | .................. | G09G 3/3674 377/64 |
| 2014/0176410 A1* | 6/2014 | Ma | ....................... | G09G 3/3622 345/92 |
| 2014/0240209 A1* | 8/2014 | Zhang | .................. | G09G 3/3648 345/92 |
| 2015/0325181 A1* | 11/2015 | Wang | ....................... | G09G 3/36 377/64 |
| 2016/0027526 A1* | 1/2016 | Xu | ........................ | G11C 19/28 345/215 |

\* cited by examiner

*Primary Examiner* — Tuan T Lam
(74) *Attorney, Agent, or Firm* — Baker & Hostetler LLP (57) ABSTRACT

The present disclosure discloses a gate driving circuit including multi-stage shift registers, and an output side switch element which is controlled by the second clock signal to be turned on or off. The output side switch element is located between an input terminal and an output terminal of each stage shift register. An output terminal of the (N+2)-th stage shift register is coupled to a reset terminal of the N-th stage shift register.

20 Claims, 5 Drawing Sheets

GATE DRIVING CIRCUIT, ARRAY SUBSTRATE AND DISPLAY DEVICE

CROSS-REFERENCE TO RELATED APPLICATION

This application claims priority to Chinese Patent Application No. 201410184481.6 filed on May 4, 2014, the disclosures of which are incorporated in their entirety by reference herein.

TECHNICAL FIELD

The present disclosure relates to the field of display technology, and more particularly to a gate driving circuit, an array substrate and a display device.

BACKGROUND

Thin film transistor liquid crystal display (TFT-LCD) is one of liquid crystal display panels, adopts the thin film transistor technology and may significantly improve image quality.

As an important part of a driver of the TFT-LCD, a gate driving circuit is mainly used to use shift registers to convert input clock signals and apply the converted signals to gate lines of the liquid crystal display panel. In multi-stage shift registers of the gate driving circuit, each stage shift register is connected to corresponding gate lines so as to output gate line driving signals. In the gate driving circuit, various stage shift registers are connected with one another, an initial signal is input to a first stage shift register of the various stage shift registers, and gate line driving signals are output in order to various stage shift registers of gate lines. An input terminal of a current stage shift register is connected to an output terminal of a previous stage shift register, and an output terminal of a next stage shift register is connected to a control terminal of the current stage shift register.

In the existing technology, the output terminal of the next stage shift register is connected back to a reset terminal of the current stage shift register, that is, at the time of outputting the gate line driving signal in the next stage shift register, the gate line driving signal of the current stage shift register is reset, so as to prepare for a next transfer of signal.

However, since resolution of the liquid crystal display devices is higher and higher, when outputting the gate line signals, a period for writing data signal is shorter and shorter. If still adopting the gate line driving circuit in the existing technology, an abnormal image display is easily caused due to less period for writing data signal, resulting that display failure easily occurs on the liquid crystal display having a high resolution, which cannot satisfy users' requirements for display effect.

SUMMARY

For the defects of the existing technology, embodiments of the present disclosure provide a gate driving circuit, an array substrate and a display device, which may advance outputting of a gate line output signal of each stage shift register of the gate driving circuit, and double an output duration of the gate line output signal, thereby greatly increasing writing time of data signal and reducing possibility of occurrence of display failure.

In order to achieve the above object, the technical solution of the present disclosure is as follow.

A gate driving circuit includes multi-stage shift registers, and each stage shift register of the multi-stage shift registers is coupled with both of a first clock signal line and a second clock signal line;

wherein, for any integer N which is not less than 2, an input terminal of an N-th stage shift register is coupled with an output terminal of an (N−1)-th stage shift register; an output terminal of the N-th stage shift register is coupled with an input terminal of an (N+1)-th stage shift register; a reset terminal of the N-th stage shift register is coupled with an output terminal of an (N+2)-th stage shift register;

the gate driving circuit further includes an output side switch element disposed between the input terminal and the output terminal of the N-th stage shift register;

the output terminal of the N-th stage shift register is coupled with a second terminal of the output side switch element;

a first terminal of the output side switch element is coupled with the input terminal of the N-th shift register; a control terminal of the output side switch element is coupled with the second clock signal line.

Optionally, each stage shift register includes a first switch element, a second switch element, a third switch element, a fourth switch element, a fifth switch element, a sixth switch element, an eighth switch element, a ninth switch element, a tenth switch element and a storage capacitor; wherein a control terminal of the first switch element is coupled with the first terminal of the first switch element;

a second terminal of the first switch element, a first terminal of the second switch element, a control terminal of the third switch element, a control terminal of the sixth switch element, a control terminal of the eighth switch element, a first terminal of the tenth switch element and a first terminal of the storage capacitor are connected;

a second terminal of the storage capacitor is coupled with a second terminal of the third switch element and a first terminal of a fourth switch element;

a control terminal of the fourth switch element is coupled with a first terminal of the fifth switch element, a first terminal and a control terminal of the ninth switch element;

a second terminal of the fifth switch element, a first terminal of the sixth switch element, a first terminal of the tenth switch element are connected;

a second terminal of the ninth switch element, a control terminal of the fifth switch element, a first terminal of the eight switch element are connected.

Optionally, the first terminal of the first switch element is coupled with an interface of the input terminal of the N-th stage shift register; the second terminal of the storage capacitor is coupled with an interface of the output terminal of the N-th stage shift register.

Optionally, the control terminal of the second switch element is coupled with an interface of a reset terminal of the N-th stage shift register.

Optionally, each stage shift register connecting to both of the first clock signal line and the second clock signal line comprises the first terminal of the third switch element is coupled with the first clock signal line;

the first terminal of the fifth switch element is coupled with the second clock signal line.

Optionally, the second terminals of the second switch element, the fourth switch element, the sixth switch element, the eighth switch element and the tenth switch element, are coupled with a working low-level interface of the N-th stage shift register.

Optionally, the first switch element, the second switch element, the third switch element, the fourth switch element, the fifth switch element, the sixth switch element, the eighth switch element, the ninth switch element, the tenth switch element and the output side switch elements are thin film transistors.

Optionally, the first terminal, the second terminal and the control terminal of each of the first switch element, the second switch element, the third switch element, the fourth switch element, the fifth switch element, the sixth switch element, the eighth switch element, the ninth switch element, the tenth switch element and the output side switch elements are a drain, a source and a gate of the thin film transistor, respectively.

Optionally, the output side switch element is integrated in the N-th stage shift register An array substrate includes the above gate driving circuit.

A display device includes the above array substrate.

The present disclosure at least has following benefit effects:

Based on the existing shift register, between an input terminal and an output terminal of each stage shift register, one output side switch element which is controlled by the second clock signal to be turned on or off is added, and a reset connection mode of coupling the output terminal of the (N+2)-th stage shift register to the reset terminal of the N-th stage shift register is used to replace an original reset connection mode of coupling an output terminal of a next stage shift register to a reset terminal of a previous stage shift register. Thus, comparing with the existing technology, a gate line output signal of each stage shift register of the gate driving circuit may be output ahead, and output duration of the gate line output signal is doubled, thereby greatly increasing writing time of a data signal and reducing possibility of occurrence of display failure.

BRIEF DESCRIPTION OF THE DRAWINGS

In order to illustrate technical solutions according to embodiments of the present disclosure or in the prior art more clearly, drawings to be used in the description of the prior art or the embodiments will be described briefly hereinafter. Apparently, the drawings described hereinafter are only some embodiments of the present disclosure, and other drawings may be obtained by those skilled in the art according to those drawings without creative work.

DETAILED DESCRIPTION

In order to make the objects, technical solutions and advantages of the embodiments of the present disclosure more clear, the technical solutions according to the embodiments of the present disclosure will be clearly and fully described hereinafter in conjunction with the accompanying drawings in the embodiments of the present disclosure. Apparently, the embodiments are only some of the embodiments of the present disclosure, rather than all the embodiments. Based on the described embodiments of the present disclosure, all other embodiments that are acquired by those skilled in the art without inventive work are all within the scope of protection of the present disclosure.

Figure 1:
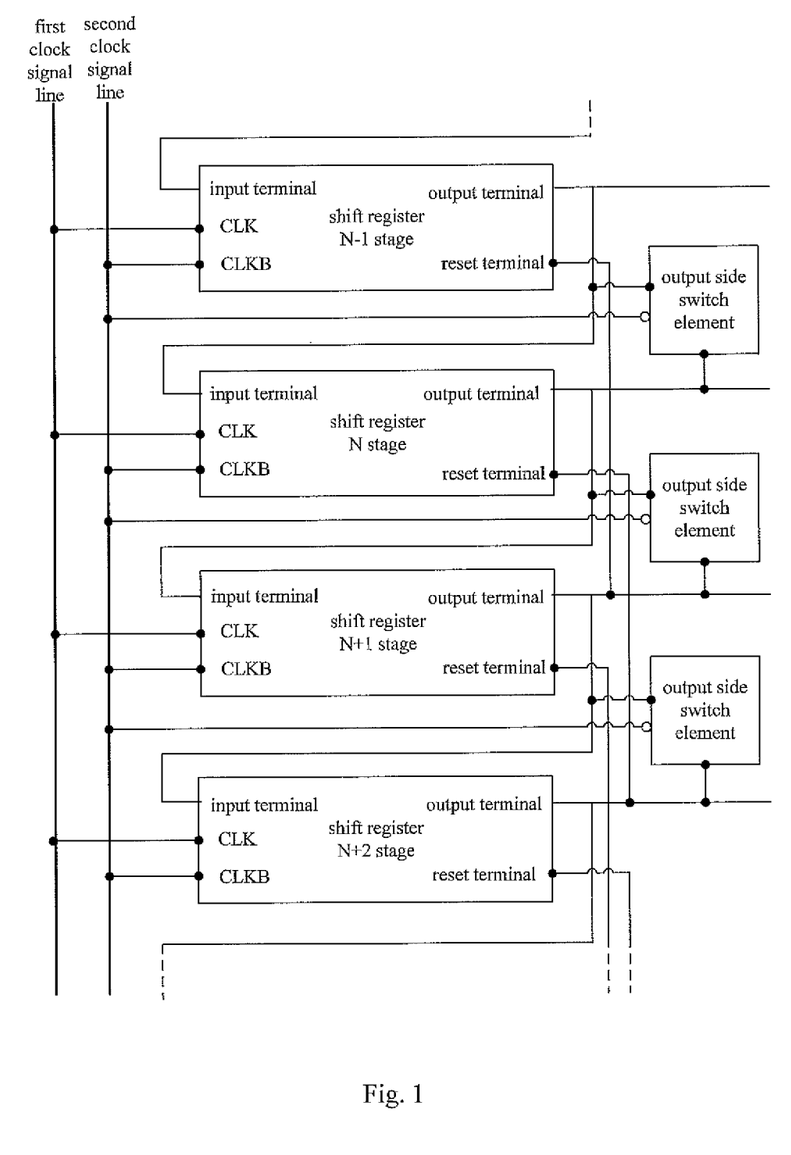
FIG. 1 is a schematic diagram showing a structure of a gate driving circuit according to one embodiment of the present disclosure.

One embodiment of the present disclosure provides a gate driving circuit. Referring to FIG. 1, the gate driving circuit includes multi-stage shift registers, and each stage shift register of the multi-stage shift registers is coupled with both of a first clock signal line and a second clock signal line.

For any integer N which is not less than 2, an input terminal of an N-th stage shift register is coupled with an output terminal of an (N−1)-th stage shift register; an output terminal of the N-th stage shift register is coupled with an input terminal of an (N+1)-th stage shift register; a reset terminal of the N-th stage shift register is coupled with an output terminal of an (N+2)-th stage shift register.

The output terminal of the N-th stage shift register is further coupled with a second terminal of an output side switch element; a first terminal of the output side switch element is coupled with the input terminal of the N-th stage shift register; a control terminal of the output side switch element is coupled with the second clock signal line.

CLK is a first clock signal interface for each stage shift register of the multi-stage shift registers, CLKB is a second clock signal interface for each stage shift register of the multi-stage shift registers. The two clock signals fluctuate back and forth at a fixed frequency between high and low levels. The first clock signal and the second clock signal are inverted from each other, thus, the two clock signals may also be referred as "clock signal" and "inverted clock signal".

It can be seen, after a gate line driving signal is input to an input terminal of a first stage shift register, as driven by clock signals, the gate line driving signal is transferred backward state by stage. However, unlike the existing technologies, in one embodiment of the present disclosure, the output terminal of the (N+2)-th stage shift register (instead of an output terminal of the (N+1)-th stage shift register) is coupled with the reset terminal of the N-th stage shift register. That is, after the signal is transferred to the (N+2)-th stage shift register, the output terminal of the N-th stage shift register returns to the low level from the high level. In addition, between an input terminal and an output terminal of each stage shift register, an output side switch element which is controlled by the inverted clock signal (i.e., the second clock signal) to be turned on or off is added. That is to say, at the time when the signal is transferred to the (N−1)-th stage shift register, the added switch element is turned on, an output signal of the (N−1)-th stage shift register is transferred to the output terminal of the N-th stage shift register through the switch element, i.e., an output signal of the N-th stage shift register is output ahead by one line.

By integrating designs of these two aspects, a gate line output signal of each stage shift register of the gate driving circuit may be output ahead, and an output duration of the gate line output signal is doubled, thereby greatly increasing a period for writing a data signal and reducing possibility of occurrence of display failure.

In order to describe the technical solution of one embodiment of the present disclosure in details, based on a specific circuit structure of a shift register in the prior art, a gate driving circuit of one embodiment of the present disclosure will be described in details.

Figure 2:
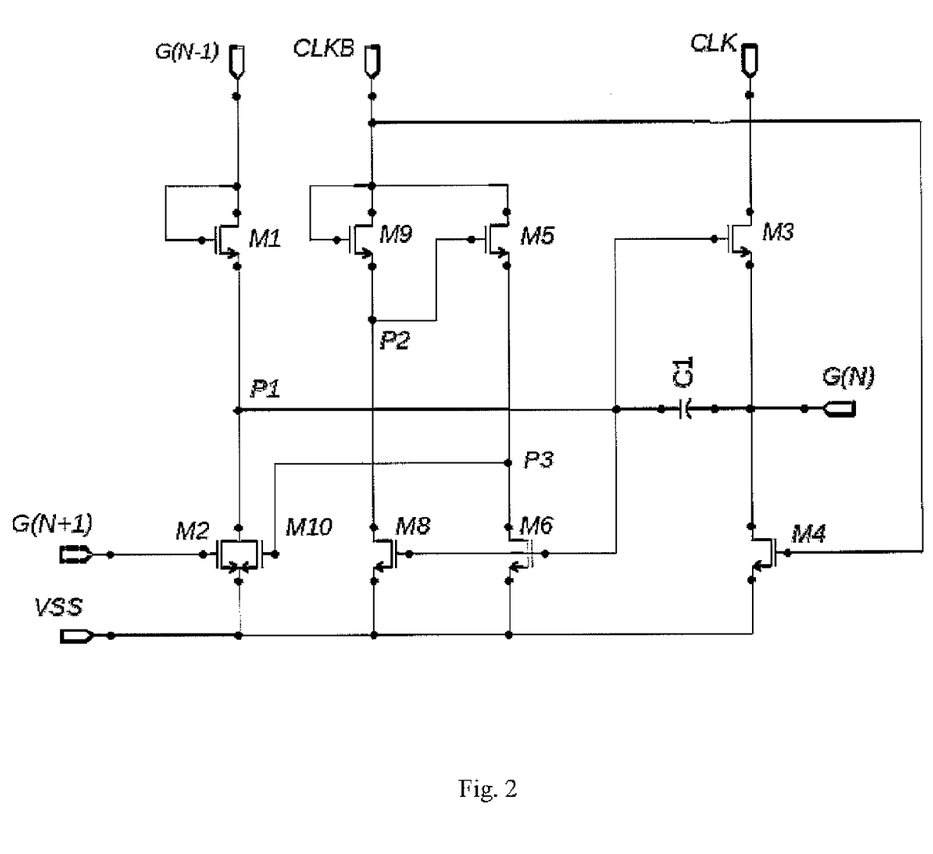
FIG. 2 is a schematic diagram showing a circuit structure of a shift register in the prior art.

FIG. 2 is a schematic diagram showing a circuit structure (an N-th stage) of a shift register in the prior art. Referring to FIG. 2, the circuit structure includes ten switch elements including M1 to M10, and a storage capacitor C1. A specific connection relationship is as follow.

A control terminal of a first switch element Ml is coupled with a first terminal of the first switch element Ml;

A second terminal of the first switch element Ml, a first terminal of a second switch element M2, a control terminal of a third switch element M3, a control terminal of a sixth switch element M6, a control terminal of an eighth switch element M8, a first terminal of a tenth switch element M10 and a first terminal of the storage capacitor C1 are connected to a point P1;

A second terminal of the storage capacitor Cl is coupled with a second terminal of the third switch element M3 and a first terminal of a fourth switch element M4;

A control terminal of the fourth switch element M4 is coupled with a first terminal of a fifth switch element M5, a first terminal and a control terminal of a ninth switch element M9;

A second terminal of the fifth switch element M5, a first terminal of the sixth switch element M6, a first terminal of the tenth switch element M10 are connected to a point P3;

A second terminal of the ninth switch element M9, a control terminal of the fifth switch element M5, a first terminal of the eight switch element M8 are connected to a point P2.

The first terminal of the first switch element M1 is coupled with an interface G(N−1) of an input terminal of the shift register; the second terminal of the storage capacitor C1 is coupled with an interface G(N) of an output terminal of the shift register. The control terminal of the second switch element M2 is coupled with an interface G(N+1) of a reset terminal of the shift register.

Each stage shift register connecting to both of the first clock signal line and the second clock signal line represents following connection relationship: the first terminal of the third switch element M3 is coupled with the first clock signal line CLK; the first terminal of the fifth switch element M5 is coupled with the second clock signal line CLKB.

When a working voltage is biased, the second terminals of M2, M4, M6, M8 and M10 are coupled with a working low-level interface VSS of the shift register.

Optionally, each of the output side switch elements and the first to tenth switch elements M1-M10 is a thin film transistor or other electrical components having the similar function. The firs terminal is a drain of the thin film transistor; the second terminal is a source of the thin film transistor, and a control terminal is a gate of the thin film transistor.

Figure 3:
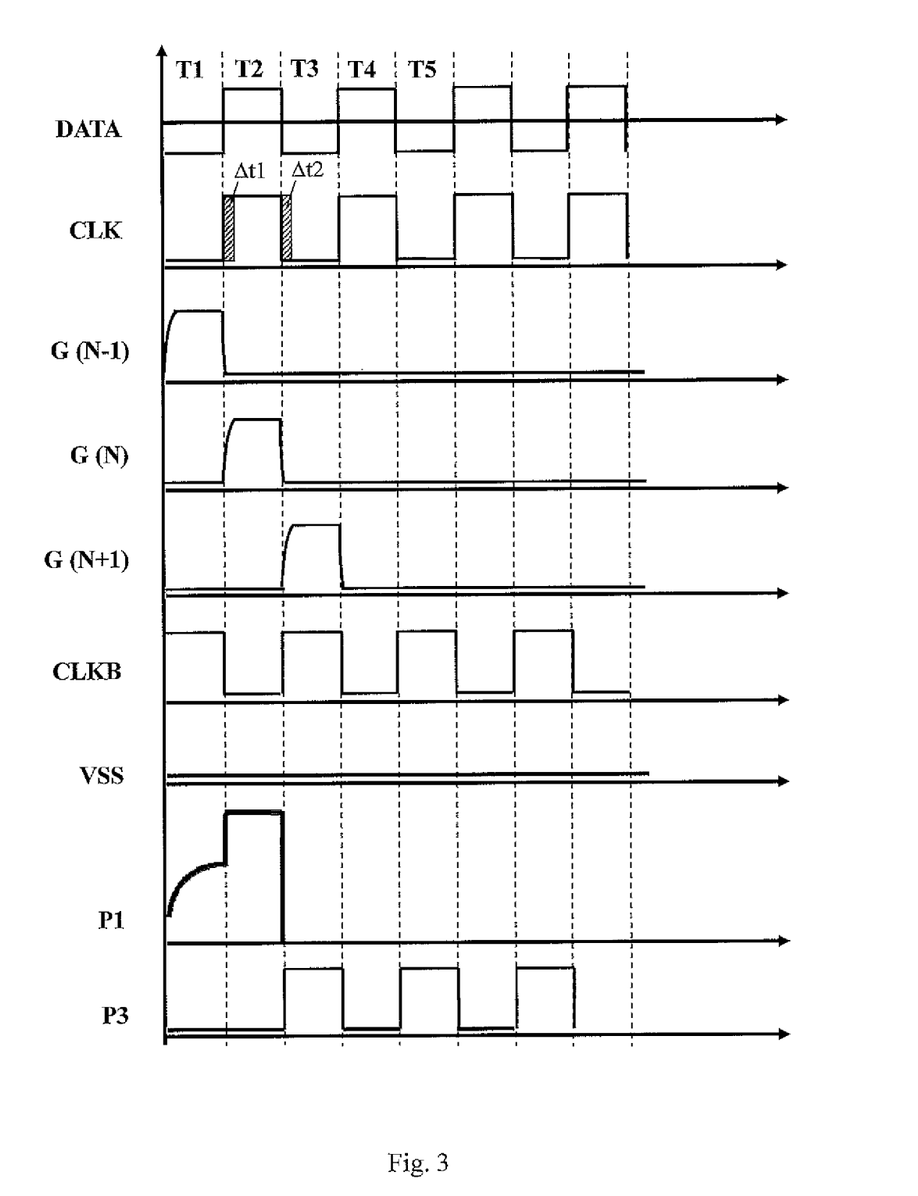
FIG. 3 is a logic timing diagram corresponding to the circuit structure of the shift register in the prior art.

Referring to FIG. 3, FIG. 3 a logic timing diagram showing how the gate driving signal driven by the clock signals passes through the N-th stage shift register. DATA represents the data signal described above. The detailed working principle of the circuit belongs to the existing technology and will not be repeated here.

Figure 4:
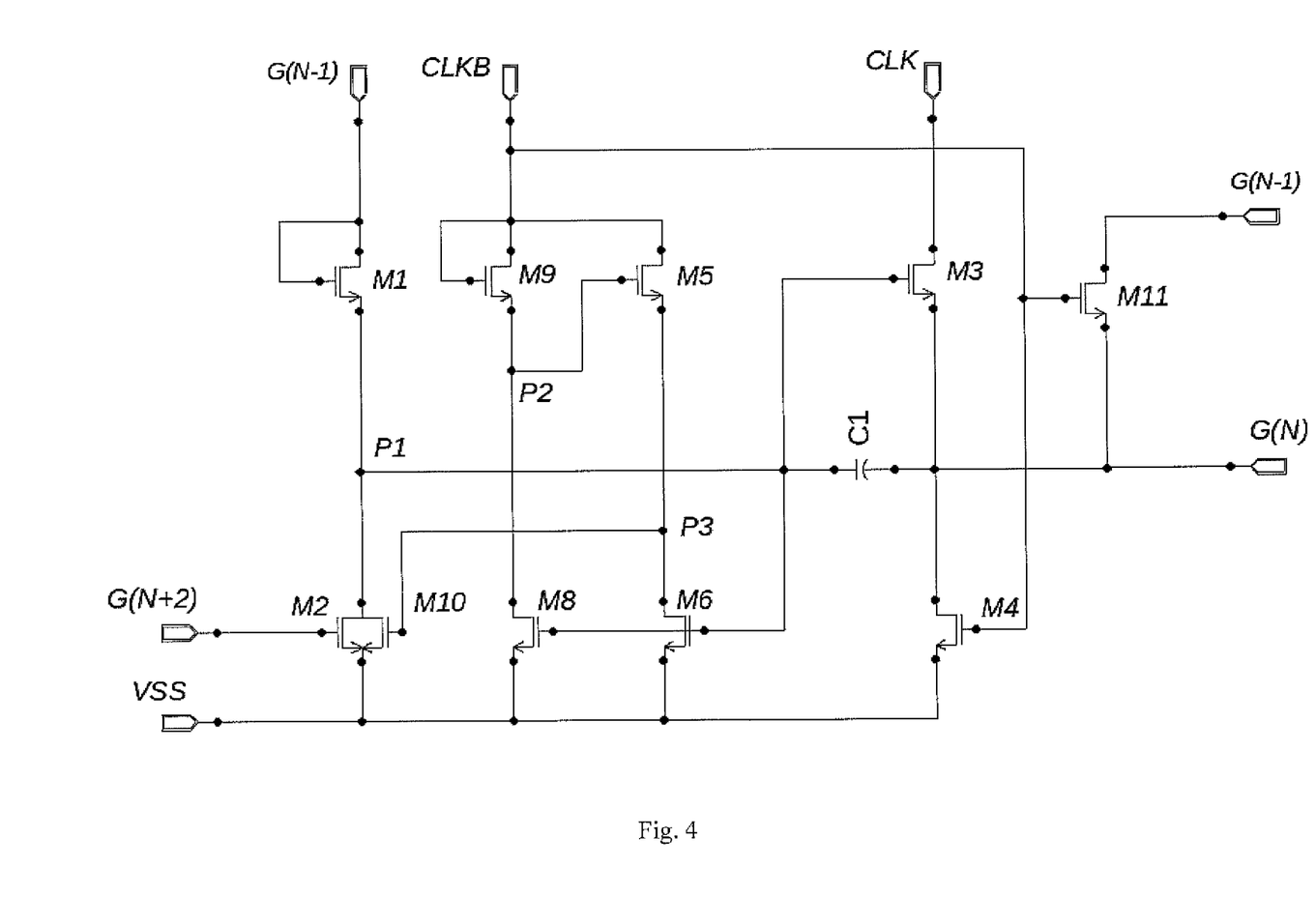
FIG. 4 is a schematic diagram showing a circuit structure of a shift register of a gate driving circuit according to one embodiment of the present disclosure.

Corresponding to this circuit, here, the output side switch elements may optionally be integrated in the shift register, and may be added to the circuit as an eleventh switch element M11 of the shift register. A circuit of the N-th stage shift register which includes the eleventh switch element M11 is shown in FIG. 4. A first terminal of a transistor M11 which is used as the output side switch element, is coupled with the interface G(N−1) of the input terminal, a second terminal of the transistor M11 is coupled with the interface G(N) of the output terminal. Of course, the output side switch element may not be used as parts of the shift register, as long as the output side switch elements are connected with the various stage shift registers in a similar connection relationship.

Figure 5:
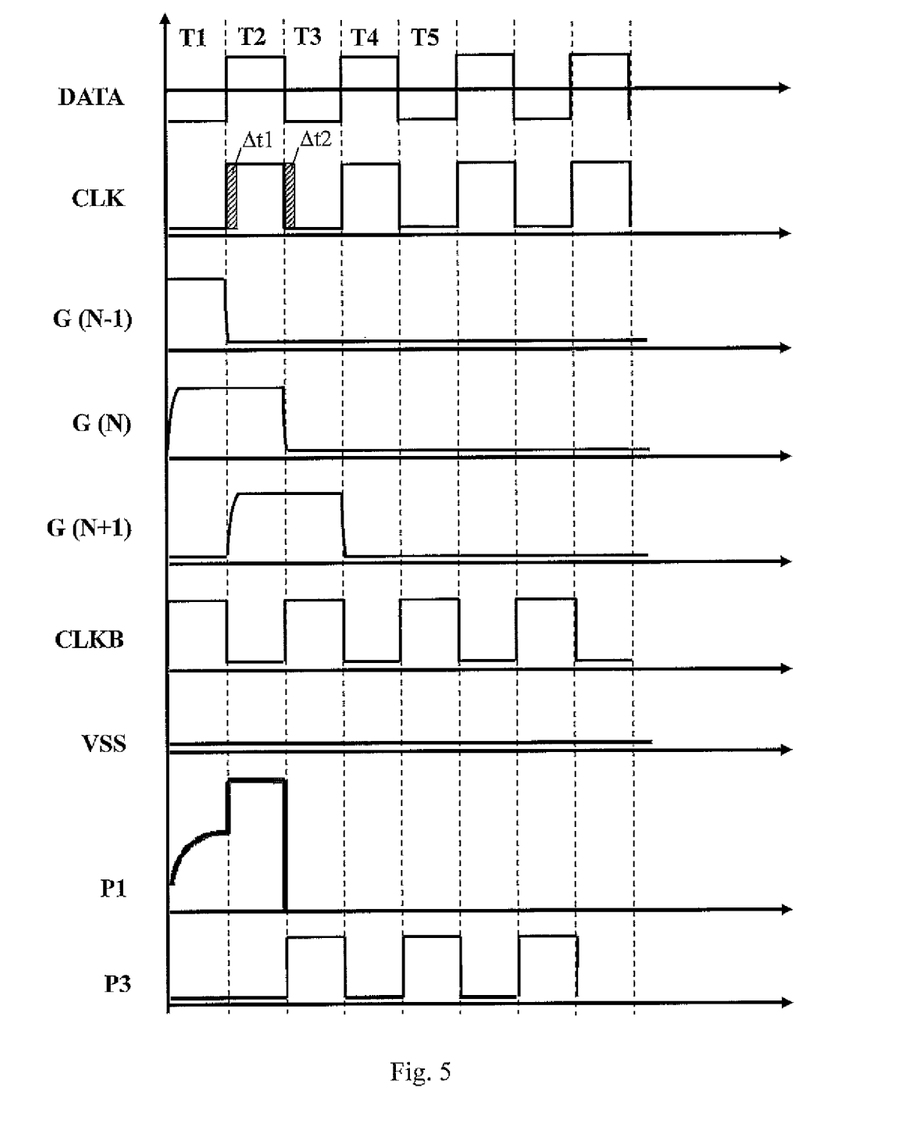
FIG. 5 is a logic timing diagram corresponding to the circuit structure of the shift register of the gate driving circuit according to one embodiment of the present disclosure.

Referring to FIG. 5, a working principle of the Nth stage shift register is as follows.

First phase T1: the clock signal CLK is low level, the inverted clock signal CLKB is high level; an output signal G(N−1) of a previous stage shift register, as an input signal, is high level; an output signal G(N+2) of a next stage shift register, as a reset signal, is low level; VSS is low level signal. The output signal G(N−1) of high level make the transistor M1 turn on and charge the capacitor C1, so that the point P1 is changed to high level; at this time, a gate switch of the transistor M3 is turned on, but since the inverted clock signal CLKB is high level at this time, the transistor M11 is turned on and the output terminal G(N) outputs a high level.

In this phase, transistors M5, M6, M8 and M9 are turned on, the P3 point is low level, the transistors M10 and M2 are cut off, thereby ensuring normally outputting of the output terminal G(N).

Second phase T2: the clock signal CLK is high level, the inverted clock signal CLKB is low level, an input signal G(N−1) is low level, a reset signal G(N+2) is low level; at this time, the transistor M1 is in a cut-off state, the transistor M3 is turned on, the output terminal G(N) outputs a high level; meanwhile, the output terminal G(N) is used as an input signal for a next stage gate driving circuit; in the next stage gate driving circuit, the transistor M11 is turned on, an output terminal G(N+1) is high level.

In this phase, the transistors M5 and M9 are cut off, the gates of the transistors M6 and M8 are tuned on, the P3 point is low level, the transistors M10 and M2 are cut off, thereby ensuring normally outputting of the output terminal G(N).

Third phase T3: the clock signal CLK is low level, the inverted clock signal CLKB is high level, the input signal G(N−1) is low level, the reset signal G(N+2) is low level; at this time, the transistor M1 is cut-off, the gate of the transistor M3 is turned on, but since the clock signal CLK is low level, the output terminal G(N) is low level.

In this phase, the transistors M5 and M9 are turned on, the transistors M6 and M8 are cut off, the P3 point is high level, the transistor M10 is turned on, and the p1 point is discharged; since the reset signal G(N+2) is low level, the transistor M2 is cut off.

Fourth phase T4: the clock signal CLK is high level, the inverted clock signal CLKB is low level, the input signal G(N−1) is low level, the reset signal G(N+2) is high level; at this time, the transistors M1 and M4 are in a cut-off state, the transistor M2 is turned on, the capacitor C1 and the output terminal is discharged to cause a potential of the P1 point is low level. Meanwhile, the transistor M3 is cut off, and the output terminal G(N) outputs low level.

In this phase, the transistors M5, M6, M8, M9, M10 and M11 are cut off, and the point P3 is low level.

It can be seen, in the second phase T2, both of the output terminals G(N) and G(N+1) are high level, data signal is simultaneously written into the N-th stage shift register and the (N+1)-th stage shift register. In the third phase T3, since the output terminal G(N) is low level, thus, when the output terminal G(N) is low level, pixels hi the N-th stage store data signal voltage which is written in the period of T2. The output terminal G(N+1) of the (N+1)-th stage shift register continues being high level in the period of T3, thus, the data signal voltage which is written in the period of T2 is not stored in pixels of the (N+1)-th stage shift register, and the pixels of the (N+1)-th stage shift register store data signal voltage which is written in the period of T3. Further, in the period of T2, although the pixels of the N-th stage shift register and the (N+1)-th stage shift register display the same color, comparing with a period for displaying one frame image, a display time when the pixels of the N-th stage shift register and the (N+1)-th stage shift register display the same color is very short, and human eyes cannot distinguish the difference, thus, simultaneously outputting of the gate signal line in the N-th stage shift register and the (N+1)-th stage shift register in the period of T2 does not affect display effect.

Thus, setting a clock cycle to be 2 T, in one embodiment of the present disclosure, an output duration of the gate line driving signal of each stage shift register may be increased from original T to 2 T (affected by $\Delta t1$ and $\Delta t2$), that is, the output duration is doubled. Meanwhile, one embodiment of the present disclosure may advance arrival time of the gate line driving signal of each stage by T. thus, during the output duration of the gate line driving signal, the period for writing the data signal is greatly increased, thereby reducing possibility of occurrence of display failure.

On the other hand, in the existing technology, the ability of writing data signal in the period of $\Delta t1$ and $\Delta t2$ is reduced due to signal delay caused by resistance and load capacitance of gate lines. For high-resolution LCD monitors, scanning time for each line (corresponding to each stage shift register) is only ten microseconds, delay time of the gate signal is about 2 microseconds, the reduction of an actual writing time of the data signal may result in insufficient charging pixels.

In the gate driving circuit of one embodiment of the present disclosure, since the gate signal of each line is output ahead by one line, this may eliminate signal delay caused by resistance and load capacitance of gate lines and greatly improve the ability of writing data signal, and remedy the defect of insufficient charging pixels in high-resolution LCD monitors of the existing technology.

Based on the same inventive concept, one embodiment of the present disclosure provides an array substrate. The array substrate includes any one of the above gate driving circuits.

Since the array substrate provided in one embodiment of the present disclosure has same technical features as those of the gate driving circuit of the above embodiment, and thus, the array substrate may also solve the same technical problem and produce the same technical effect.

Based on the same inventive concept, one embodiment of the present disclosure provides a display device. The display device includes the array substrate of the above embodiment. The display device may be a liquid crystal panel, an electronic paper, an OLED panel, a mobile phone, a tablet PC, a display apparatus, a notebook, a digital frame, a navigator, or any other product or component having display function.

Since the display device provided in one embodiment of the present disclosure has same technical features as those of the array substrate of the above embodiment, and thus, the display device may also solve the same technical problem and produce the same technical effect.

In sum, based on the existing technology, between an input terminal and an output terminal of each stage shift register, one output side switch element which is controlled by the second clock signal to be turned on or off is added, and a reset connection mode of coupling the output terminal of the (N+2)-th stage shift register to the reset terminal of the N-th stage shift register is used to replace an original reset connection mode of coupling an output terminal of a next stage shift register to a reset terminal of a previous stage shift register relative to the next stage shift register.

Thus, comparing with the existing technology, a gate line output signal of each stage shift register of the gate driving circuit may be output ahead, and output duration of the gate line output signal is doubled, thereby greatly increasing writing time of data signal and reducing possibility of occurrence of display failure.

Unless otherwise defined, the technical or scientific terminology used herein should have the same meaning as commonly understood by one of ordinary skill in the art to which this invention belongs. Terms such as "first", "second" and the like used in specification and claims of the patent application of the invention do not show any order, number or importance, but are only used to distinguish different constituent parts. Likewise, a term "a," "an," or the like does not indicate limitation in number, but specifies the presence of at least one. A term such as "comprises," "comprising," "includes," "including", "contains" or the like means that an element or article ahead of this term encompasses element(s) or article(s) listed behind this term and its (their) equivalents, but does not preclude the presence of other elements or articles.

The foregoing embodiments are merely used to illustrate the present invention, but shall not be used to limit the present invention. For those skilled in the art, some modifications and alterations may be made without departing from the basic concept and the scope of the present invention, and these should fall within the scope of the present invention. Thus, the protection scope of the present invention should be based on the claims.

What is claimed is:

1. A gate driving circuit comprising multi-stage shift registers, and each stage shift register of the multi-stage shift registers is coupled with both of a first clock signal line and a second clock signal line;

wherein, for any integer N which is not less than 2, an input terminal of an N-th stage shift register is coupled with an output terminal of an (N−1)-th stage shift register; an output terminal of the N-th stage shift register is coupled with an input terminal of an (N+1)-th stage shift register; a reset terminal of the N-th stage shift register is coupled with an output terminal of an (N+2)-th stage shift register;

the gate driving circuit further comprises an output side switch element disposed between the input terminal and the output terminal of the N-th stage shift register;

the output terminal of the N-th stage shift register is coupled with a second terminal of the output side switch element;

a first terminal of the output side switch element is coupled with the input terminal of the N-th stage shift register; a control terminal of the output side switch element is coupled with the second clock signal line.

2. The gate driving circuit according to claim 1, wherein each stage shift register comprises a first switch element, a second switch element, a third switch element, a fourth switch element, a fifth switch element, a sixth switch element, an eighth switch element, a ninth switch element, a tenth switch element and a storage capacitor; wherein a control terminal of the first switch element is coupled with a first terminal of the first switch element;

a second terminal of the first switch element, a first terminal of the second switch element, a control terminal of the third switch element, a control terminal of the sixth switch element, a control terminal of the eighth switch element, a first terminal of the tenth switch element and a first terminal of the storage capacitor are connected;

a second terminal of the storage capacitor is coupled with a second terminal of the third switch element and a first terminal of a fourth switch element;

a control terminal of the fourth switch element is coupled with a first terminal of the fifth switch element, a first terminal and a control terminal of the ninth switch element;

a second terminal of the fifth switch element, a first terminal of the sixth switch element, a first terminal of the tenth switch element are connected;

a second terminal of the ninth switch element, a control terminal of the fifth switch element, a first terminal of the eight switch element are connected.

3. The gate driving circuit according to claim 2, wherein the first terminal of the first switch element is coupled with an interface of the input terminal of the N-th stage shift register; the second terminal of the storage capacitor is coupled with an interface of the output terminal of the N-th stage shift register.

4. The gate driving circuit according to claim 2, wherein the control terminal of the second switch element is coupled with an interface of a reset terminal of the Nth stage shift register.

5. The gate driving circuit according to claim 2, wherein each stage shift register connecting to both of the first clock signal line and the second clock signal line comprises:

the first terminal of the third switch element is coupled with the first clock signal line;

the first terminal of the fifth switch element is coupled with the second clock signal line.

6. The gate driving circuit according to claim 2, wherein the second terminals of the second switch element, the fourth switch element, the sixth switch element, the eighth switch element and the tenth switch element, are coupled with a working low-level interface of the N-th stage shift register.

7. The gate driving circuit according to claim 2, wherein the first switch element, the second switch element, the third switch element, the fourth switch element, the fifth switch element, the sixth switch element, the eighth switch element, the ninth switch element, the tenth switch element and the output side switch elements are thin film transistors.

8. The gate driving circuit according to claim 3, wherein the first switch element, the second switch element, the third switch element, the fourth switch element, the fifth switch element, the sixth switch element, the eighth switch element, the ninth switch element, the tenth switch element and the output side switch elements are thin film transistors.

9. The gate driving circuit according to claim 4, wherein the first switch element, the second switch element, the third switch element, the fourth switch element, the fifth switch element, the sixth switch element, the eighth switch element, the ninth switch element, the tenth switch element and the output side switch elements are thin film transistors.

10. The gate driving circuit according to claim 5, wherein the first switch element, the second switch element, the third switch element, the fourth switch element, the fifth switch element, the sixth switch element, the eighth switch element, the ninth switch element, the tenth switch element and the output side switch elements are thin film transistors.

11. The gate driving circuit according to claim 6, wherein the first switch element, the second switch element, the third switch element, the fourth switch element, the fifth switch element, the sixth switch element, the eighth switch element, the ninth switch element, the tenth switch element and the output side switch elements are thin film transistors.

12. The gate driving circuit according to claim 11, wherein the first terminal, the second terminal and the control terminal of each of the first switch element, the second switch element, the third switch element, the fourth switch element, the fifth switch element, the sixth switch element, the eighth switch element, the ninth switch element, the tenth switch element and the output side switch elements are a drain, a source and a gate of the thin film transistor, respectively.

13. The gate driving circuit according to claim 6, wherein the output side switch element is integrated in the N-th stage shift register.

14. The gate driving circuit according to claim 2, wherein the output side switch element is integrated in the N-th stage shift register.

15. The gate driving circuit according to claim 3, wherein the output side switch element is integrated in the N-th stage shift register.

16. The gate driving circuit according to claim 4, wherein the output side switch element is integrated in the N-th stage shift register.

17. The gate driving circuit according to claim 5, wherein the output side switch element is integrated in the Nth stage shift register.

18. The gate driving circuit according to claim 6, wherein the output side switch element is integrated in the N-th stage shift register.

19. An array substrate comprising a gate driving circuit according to claim 1.

20. A display device comprising an array substrate according to claim 19.

* * * * *